United States Patent
Hazama et al.

(10) Patent No.: US 7,263,000 B2
(45) Date of Patent: Aug. 28, 2007

(54) NAND TYPE MEMORY WITH DUMMY CELLS ADJACENT TO SELECT TRANSISTORS BEING BIASED AT DIFFERENT VOLTAGE DURING DATA ERASE

(75) Inventors: Hiroaki Hazama, Tokyo (JP); Norio Ootani, Yokkaishi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/378,273

(22) Filed: Mar. 20, 2006

(65) Prior Publication Data

US 2006/0158937 A1    Jul. 20, 2006

Related U.S. Application Data

(62) Division of application No. 10/673,177, filed on Sep. 30, 2003, now Pat. No. 7,079,437.

(30) Foreign Application Priority Data

Sep. 30, 2002    (JP)    ............................. 2002-286055

(51) Int. Cl.
*G11C 11/34* (2006.01)
(52) U.S. Cl. ............................. 365/185.2; 365/185.17; 365/185.18; 365/185.19; 365/185.29
(58) Field of Classification Search ........ 365/185.17 X, 365/185.18 X, 185.19 X, 185.2, 185.29 X, 365/185.33, 210 X, 185.17, 185.18, 185.19, 365/185.29, 210
See application file for complete search history.

(56) References Cited

U.S. PATENT DOCUMENTS

| | | | |
|---|---|---|---|
| 5,524,094 A | 6/1996 | Nobukata et al. | |
| 5,815,436 A | 9/1998 | Tanaka et al. | |
| 6,011,287 A | 1/2000 | Itoh et al. | |
| 6,055,181 A | 4/2000 | Tanaka et al. | |
| 6,188,608 B1 | 2/2001 | Maruyama et al. | |
| 6,222,774 B1 * | 4/2001 | Tanzawa et al. | ....... 365/185.29 |

FOREIGN PATENT DOCUMENTS

| | | |
|---|---|---|
| JP | 3-295098 | 12/1991 |
| JP | 09-167807 | 6/1997 |
| JP | 09-232454 | 9/1997 |
| JP | 11-86571 | 3/1999 |
| JP | 11-353884 | 12/1999 |
| JP | 2000-022113 | 1/2000 |
| JP | 2000-285692 | 10/2000 |
| JP | 2001-084788 | 3/2001 |

* cited by examiner

*Primary Examiner*—Van Thu Nguyen
(74) *Attorney, Agent, or Firm*—Oblon, Spivak, McClelland, Maier & Neustadt, P.C.

(57) ABSTRACT

A nonvolatile semiconductor memory device is provided having a plurality of electrically rewritable nonvolatile memory cells connected in series together. A select gate transistor is connected in series to the serial combination of memory cells. A certain one of the memory cells which is located adjacent to the select gate transistor is for use as a dummy cell. This dummy cell is not used for data storage. During data erasing, the dummy cell is applied with a different bias voltage as that for the other memory cells.

3 Claims, 13 Drawing Sheets

| | Read | Erase | Write |
|---|---|---|---|
| BL | Vbl=0.5V | Floating | "0"—Vss<br>"1"—Vcc |
| SGD | Vcc | Floating | Vcc |
| WL | Select—Vr<br>Non-Select—Vread | 0V | Select—Vpgm<br>Non-Select—Vpass |
| DWL | Vread | 0V | Vpass |
| SGS | Vcc | Floating | 0V |
| SL | 0V | Floating | 0V |
| P Well | 0V | Vera=18V | 0V |

FIG. 5

|  | Read | Erase | Write |
|---|---|---|---|
| BL | Vbl=0.5V | Floating | "0"—Vss<br>"1"—Vcc |
| SGD | Vcc | Floating | Vcc |
| WL | Select—Vr<br>Non-Select—Vread | 0V | Select—Vpgm<br>Non-Select—Vpass |
| DWL | Vread | 0V | Vpass |
| SGS | Vcc | Floating | 0V |
| SL | 0V | Floating | 0V |
| P Well | 0V | Vera=18V | 0V |

|  | Read | Erase | Write |
|---|---|---|---|
| BL | Vbl=0.5V | Floating | "0"—Vss<br>"1"—Vcc |
| SGD | Vcc | Floating | Vcc |
| WL | Select—Vr<br>Non-Select—Vread | WL0, WL15—0V<br>WL1~WL14—0.7V | WL0, WL15 Selected Vpgm0+ΔV<br>WL1~WL14 Selected Vpgm0 |
| SGS | Vcc | Floating | 0V |
| SL | 0V | Floating | 0V |
| P Well | 0V | Vera=18V | 0V |

NAND TYPE MEMORY WITH DUMMY CELLS ADJACENT TO SELECT TRANSISTORS BEING BIASED AT DIFFERENT VOLTAGE DURING DATA ERASE

CROSS-REFERENCE TO PRIOR APPLICATION

This application is based upon and claims the benefit of priority from the prior Japanese Patent Application No. 2002-286055, filed on Sep. 30, 2002, the entire content of which is incorporated herein by reference.

BACKGROUND OF THE INVENTION

1. Field of the Invention

This invention relates generally to non-volatile semiconductor memory devices and, more particularly, to electrically erasable programmable read only memory (EEPROM) devices of the NAND type.

2. Description of Related Art

In nonvolatile semiconductor memories, memory cells of a metal oxide semiconductor (MOS) transistor structure with stacked floating and control gates are generally used. In NAND type EEPROMs, a plurality of such memory cells are connected in series to make up a NAND cell unit. One end of the NAND cell unit is connected through a select gate transistor to a bit line; the other end is coupled via a select gate transistor to a source line.

With miniaturization of memory cells, the distance between neighboring memory cells within a NAND cell unit is becoming shorter. Due to this, the floating gate of a memory cell is becoming considerably larger not only in capacitive coupling with respect to the memory cell's channel region and control gate but also in capacitive coupling to the floating and control gates of its neighboring memory cell.

In the case of NAND-EEPROMs, data write and erase are performed by applying a voltage between a control gate and a channel (p-type well region) to thereby inject electrons from the channel onto the floating gate in the form of a tunnel current or, alternatively, draw electrons out of the floating gate toward the channel. Principally in this case, a potential of the floating gate is determinable by a capacitive coupling ratio, which is defined by a capacitance between the control and floating gates and a capacitance between the floating gate and the channel.

However, when the distance between memory cells is shortened, the capacitance between neighboring memory cells affects the above-noted coupling ratio. The series-connected memory cells within a NAND cell unit are the same in structure as one another, and a variation factor of the coupling ratio among them is a form parameter. When looking at a memory cell which is located adjacent to a select gate transistor, its one side is a memory cell, and the other side thereof is the select gate transistor. The select gate transistor is different from the memory cell both in structure and in operating voltage. For this reason, those memory cells next to select gate transistors are different in write/erase characteristics from the remaining memory cells.

A detailed explanation will be given of a data erase event with reference to FIG. 13 below. In FIG. 13, there is shown a bias relationship during data erasing with respect to a range within a NAND cell unit, which includes a select gate transistor on the bitline BL side and its subsequent two memory cells. Data erase is such that "all-at-a-time" erase is performed in units of blocks. In this case, apply a voltage of zero volts (0V) to all word lines WL while applying an erase voltage Vera of 18V (Vera=18V) to a p-type well region. Set a select gate SG and a bit line BL in an electrically floating state. Although not shown in FIG. 13, a source line and a select gate line on the source line side also are similarly set in the floating state.

Whereby, at a memory cell, electrons on its floating gate FG are released or drawn out into the channel thereof. At this time, in a memory cell of a word line WL0 adjacent to a select gate line SGD, the potential of its floating gate FG is affected by a capacitance C3 between the floating gate FG and the select gate SG. More specifically, when setting the select gate SG in the floating state, its potential becomes almost equal to the erase voltage Vera of the p-type well. The result of this is that the floating gate FG of the memory cell of word line WL0 becomes higher in potential than floating gates of the other memory cells due to the presence of the coupling via the capacitance C3 between itself and control gate SG. This potential increase causes the memory cell of interest to be difficult to be erased. The same goes with a memory cell that is selected by a word line in close proximity to a select gate line on the source line side.

FIG. 14 graphically shows threshold voltages after data erase (Erase Vth) of a test structure with respect to each of sixteen word lines WL, wherein the test structure has a NAND cell unit made up of sixteen memory cells. The erase threshold voltages of the memory cells associated with word lines WL0 and WL15 next to the select gates are higher by about 0.8V than those of the other memory cells (i.e. the cells connected to word lines WL1-WL14).

A similar problem occurs in data write events. Data write is performed by setting the p-type well at 0V, precharging the channels of a NAND cell unit in a way pursuant to the data to be written, and thereafter applying a write voltage Vpgm to a selected word line. Whereby, in a memory cell which is given logic "0" data and whose channel is set at Vss, electrons are injected onto the floating gate thereof. In a memory cell that is given logic "1" data with its channel being precharged to Vcc and thus set in the floating state (namely, write inhibit memory cell), its channel potentially rises up due to the capacitive coupling so that any electron injection hardly occurs. This write technique is called the "self-boosting" scheme. Non-selected word lines are applied an intermediate voltage to ensure that hold data are not destroyed.

FIG. 15 shows word-line dependency characteristics of after-write threshold voltages (Program Vth) in the case of performing a write operation while sequentially applying write pulses to all of sixteen word lines within a NAND cell unit. Regarding the word lines WL0 and WL15 that are located next to the select gate lines, these are different in operation conditions during write from the other wordlines, due to the capacitive coupling from the select gate lines. For this reason, writing is slower than writing of the other memory cells, with the threshold voltage lowered by about 0.5V.

Additionally, an improved version of the self-boost scheme is available, which is aimed at efficient voltage boost control of only certain memory cells along a selected word line by applying the word lines neighboring upon the selected word line a voltage lower than that of the other non-selected word lines. This scheme is known as "local self-boost" scheme (for example, see U.S. Pat. No. 6,011, 287). The USP '287 also shows, in its FIG. 13, another example which sets the select gate line not in the floating state but at 0V at the time of data erasing.

It has been proposed to employ a technique for setting the threshold voltages of select gate transistors in a way conformity with operation conditions during data writing by taking account of the fact that the voltage to be applied to select gate lines affects the writing characteristics (for example, refer to Published Japanese Patent Application No. 11-86571). This handles as a problem a voltage to be transferred by a select gate transistor from a bit line toward a NAND cell channel.

As apparent from the foregoing, prior art NAND-EEPROMs are faced with a problem which follows: as the device miniaturization makes progress, the capacitive coupling of from a select gate transistor to its neighboring memory cell becomes innegligible, resulting in an increase in value variation of erase threshold voltage and write threshold voltage of the memory cells within a NAND cell unit.

SUMMARY OF THE INVENTION

In accordance with one aspect of this invention, a nonvolatile semiconductor memory device is provided which has a plurality of electrically rewritable nonvolatile memory cells connected in series, and a select gate transistor connected in series to the series-connected memory cells. In the memory device, the memory cells include a memory cell located adjacent to the select gate transistor. This cell is a dummy cell which is out of use for data storage.

In accordance with another aspect of the invention, a nonvolatile semiconductor memory device has a plurality of electrically rewritable nonvolatile memory cells connected in series, and a select gate transistor connected in series to the series-connected memory cells, wherein the memory cells include a certain memory cell adjacent to the select gate transistor. This cell is applied with a bias voltage different from a bias voltage of the remaining memory cells during data erase.

In accordance with still another aspect of the invention, a nonvolatile semiconductor memory device has a plurality of NAND cell units each having a serial combination of electrically rewritable nonvolatile memory cells, a first select gate transistor inserted between one end of the series-connected memory cells and a bit line, and a second select gate transistor inserted between the other end of the series-connected memory cells and a source line. A respective one of the NAND cell units includes memory cells which are located next to the first and second select gate transistors and which are dummy cells that are out of use for data storage. During data erasing, the dummy cells are applied with the same bias voltage as that of the remaining memory cells. During data reading and writing, the dummy cells are applied with the same bias voltage as that of non-selected memory cells.

In accordance with a further aspect of the invention, a nonvolatile semiconductor memory device has a plurality of NAND cell units each having a serial combination of electrically rewritable nonvolatile memory cells, a first select gate transistor inserted between one end of the series-connected memory cells and a bit line, and a second select gate transistor inserted between the other end of the series-connected memory cells and a source line. The memory device has a data erase mode and a data write mode. The erase mode is for erasing all memory cells formed within a well region at a time by holding control gates thereof at a low level while applying a high level of erase voltage to the well. The data write mode is for giving to a selected memory cell a write pulse voltage with a step-like increase in voltage value. In the data erase mode, a low level voltage which is given to the control gates of the memory cells next to the first and second select gate transistors are set to a potential level that is lower than a voltage as given to control gates of remaining memory cells. In the data write mode, the initial value of a write pulse voltage used when the memory cells next to the first and second select gate transistors are selected is set to a potential level higher than that when any one of the remaining memory cells is selected.

BRIEF DESCRIPTION OF THE DRAWINGS

FIG. 5 is a diagram showing potential levels of bias voltages in read, erase and write modes of the embodiment 1.

DETAILED DESCRIPTION OF THE PREFERRED EMBODIMENTS

Embodiments of this invention will now be explained with reference to the accompanying drawings below.

Embodiment 1

Figure 1:
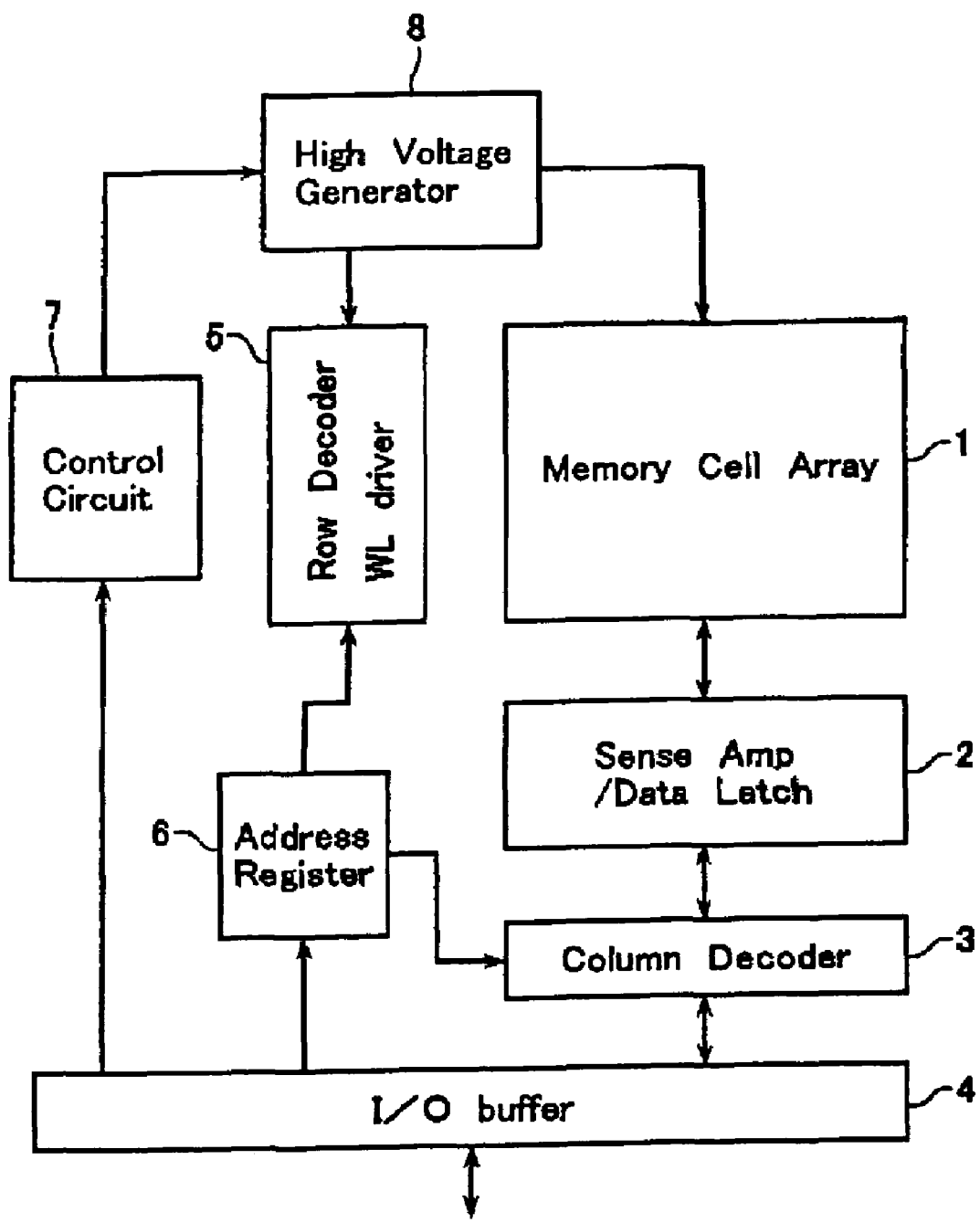
FIG. 1 is a block diagram showing a configuration of an EEPROM chip of the NAND type in accordance with an embodiment 1 of this invention.

FIG. 1 shows a block configuration of an EEPROM chip of the NAND type in accordance with one embodiment. A memory cell array 1 is arranged by layout of NAND cell units using electrically rewritable nonvolatile memory cells in a way as will be described in detail later. A sense amplifier and data latch circuit 2 functions as a sense amp circuit for sensing bit-line data of the memory cell array 1 and also as a data latch which retains write data.

Bit lines of the memory cell array 1 are subjected to selection by a column decoder 3; word lines thereof are selected and driven by a row-decoder/word-line driver 5. Row and column addresses are supplied to the row-decoder/wordline driver 5 and column decoder 3 through an input/ output (I/O) buffer 4 and also via an address register 6. Data transfer and receipt are performed between the bit lines and external I/O terminals.

A control circuit 7 is provided for performing sequence control of data write and erase operations. High voltages required for write and erase sessions are generated by a high-voltage generation circuit 8 in accordance with an operation mode, wherein the high-voltage generator 8 is controlled by the controller 7.

Figure 2:
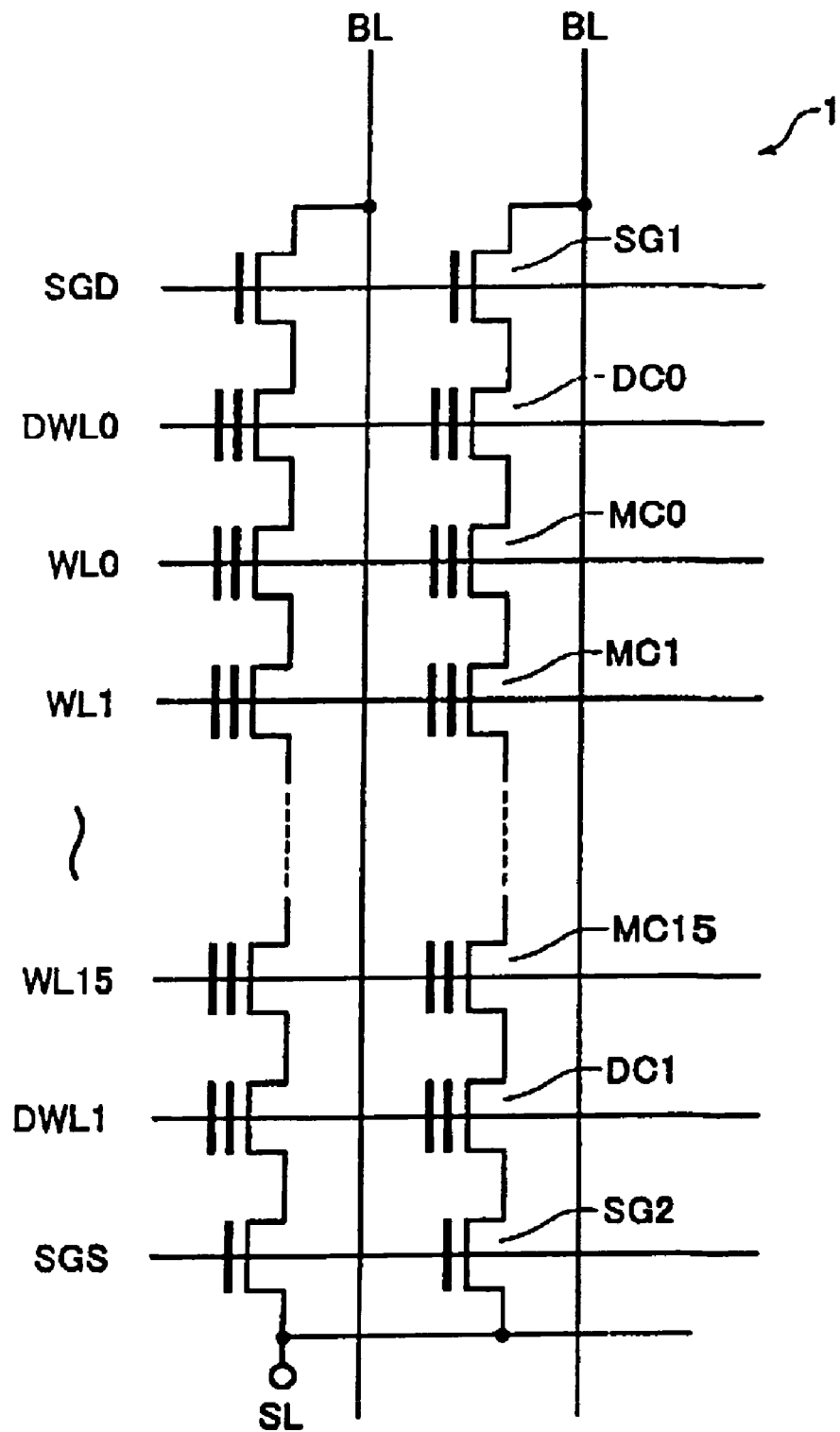
FIG. 2 shows an equivalent circuit of a memory cell array of the embodiment 1.

FIG. 2 shows an equivalent circuit of the memory cell array 1. Memory cells MC (MC0 to MC15) are such that each has a metal oxide semiconductor (MOS) transistor structure with its floating gate and a control gate insulatively stacked over the floating gate. A plurality of (sixteen, in the illustrative example) such memory cells MC are connected in series to thereby make up a NAND cell unit. A select gate transistor SG1 is inserted between one end of the NAND cell unit and a bit line BL; similarly, a select gate transistor SG2 is inserted between the other end and a source line SL.

In this embodiment, the NAND cell unit further includes a dummy cell DC0 which is inserted between the select gate transistor SG1 on the bitline side and a memory cell MC0 neighboring upon this transistor SG1, and a dummy cell DC1 which is between the select gate translator SG2 on the source line side and a memory cell MC15 adjacent thereto. While these dummy cells DC0-DC1 are principally the same in structure as the memory cells MC0-MC15, data write and read operations are not performed at the dummy cells DC0-1. In other words, dummy cells DC0-1 are not used as data storage elements.

Each memory cell MC within the NAND cell unit has its control gate which is connected to a corresponding one of word lines WL (WL0 to WL15). A word line WL is commonly connected to control gates of a plurality of memory cells aligned in a direction parallel thereto. The select gate transistors SG1 and SG2 have their gates which are provided and fabricated as select gate lines SGD and SGS extending in parallel to the word lines WL. Similarly, the dummy cells DC0-DC1 have control gates that are continuously formed as dummy word lines DWL0 and DWL1 in parallel to wordlines WL.

Figure 3:
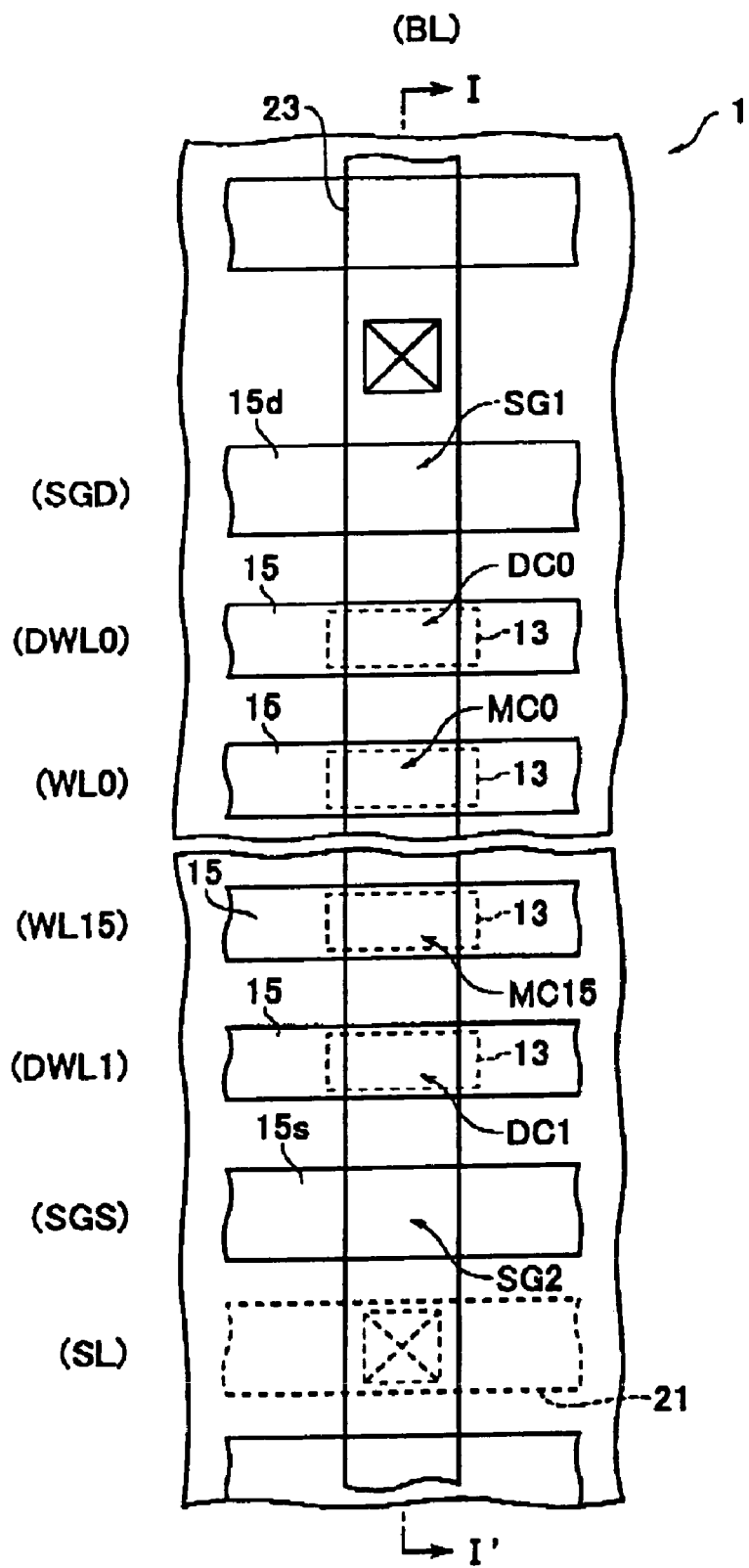
FIG. 3 is a plan view of the memory cell array.
Figure 4:
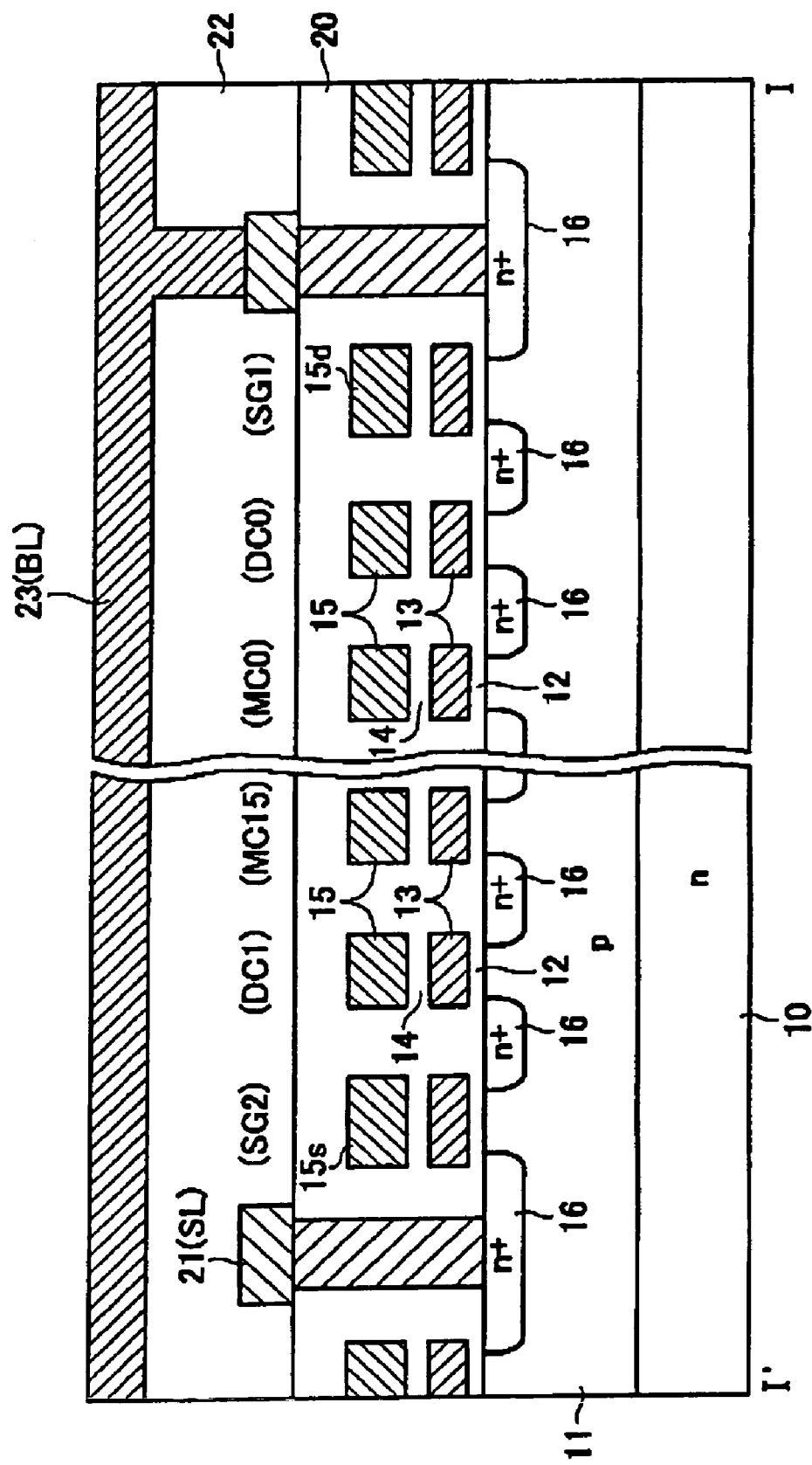
FIG. 4 is a cross-sectional view of the cell array of FIG. 3 as taken along line I-I'.

FIG. 3 shows a plan view of a single NAND cell unit. Also see FIG. 4, which is its cross-sectional view as taken along line I-I'. In a silicon substrate 10 of n type conductivity, a semiconductive well region 11 of p type conductivity is formed. In this p-type well 11, a plurality of NAND cell units are formed in the wordline direction. The range of such multiple NAND cell units formed within the p-type well 11 becomes a block which is a unit for "all-at-a-time" or "all-at-once" data erase.

A memory cell MC has a floating gate 13 which is a first-layer polycrystalline silicon film as formed above the p-type well 1 with a tunnel dielectric film 12 interposed therebetween and a control gate 15 which is a second-layer polysilicon film as stacked over the floating gate 13 with a dielectric film sandwiched therebetween. Control gate 15 is continuously formed in a one direction and becomes a word line WL. Dummy cells DC0 and DC1 are the same in structure as memory cells MC so that their control gates 15 are similarly formed continuously to become dummy word lines DWL0 and DWL1.

Select gate transistors SG1-SG2 have gate electrodes which are formed by patterning techniques as control gate lines SGD-SGS, wherein a first-layer polysilicon film which is the same as that of the memory cell floating gate 13 and a second-layer polysilicon film same as that of memory cell control gate 14 are electrically connected together at an appropriate position. Gate electrodes 15d and 15s of these select gate transistors SG1-SG2 are formed so that each is wider than the individual one of control gates 15 of memory cells MC and dummy cells DC. After having formed and patterned these word lines WL and select gate lines, n-type diffusion layers 16 are formed. The n-type diffusions 16 are for use as source/drain regions.

The memory cell array is covered or coated with an interlayer dielectric film 20. On this film 20, a source lines (SL) 21 is formed. Further, bit lines (BL) 23 are formed via an interlayer dielectric film 22.

Bias conditions for data read, erase and write operations in the EEPROM of this embodiment are shown in FIG. 5.

Data erase within a selected cell block is as follows. Let a bit line BL and select gate lines SGD and SGS be set in a floating state, set all the word lines WL at 0V, and apply an erase voltage Vera=18V to a p-type well. At this time, set dummy word lines DWL0-DWL1 also at 0V.

Whereby, electrons are drawn out of the floating gate of the memory cells within the selected block so that data are erased. While a write state high in threshold voltage with electrons stored on the floating gate is regarded as data "0," an erase state is defined as a data "1" state which is lower in threshold voltage than the former.

In the above-noted erase mode, the two dummy cells DC also are applied with the same voltage as the voltage being applied to the sixteen memory cells MC. Accordingly, this ensures that certain ones of the sixteen memory cells MC0-MC15 for use as real data storage cells—i.e., the memory cell MC0 nearest to the bit line BL, and memory cell MC15 nearest to the source line SL—are also identically the same in erase operation conditions as the remaining memory cells MC1 to MC14. More specifically, unlike the prior art, these memory cells MC0 and MC15 become free from the influence of the capacitive coupling from the select gate lines SGD and SGS so that their floating gates are applied with the same voltage as that at the other memory cells. In other words, the resultant erase speed or rate stays constant with respect to all the memory cells MC. This makes it possible to reduce any possible variation in erase threshold voltages within the NAND cells.

During data reading, precharge the bit line BL at Vbl=0.5V, for example. Thereafter, apply to a selected word line of the sixteen word lines a read voltage Vr which provides an ability to determine the threshold voltage distributions of data "0" and "1" shown in FIG. 10. Apply a pass voltage Vread to the remaining non-selected word lines and the dummy word lines DWL. This pass voltage Vread causes turn-on irrespective of whether the data is a logic "0" or "1." Apply to the select gate lines SGD and SGS a power supply voltage Vcc (or alternatively an appropriate intermediate voltage higher than the supply voltage Vcc) by way of example. With such voltage application, in case a selected memory cell turns on, its associated bit line potentially drops down; if the cell turns off, then the bitline potential is retained. Thus it is possible at the bitline to detect whether the selected memory cell turns on or off, thereby making it possible to achieve data determination.

Figures 9, 10:
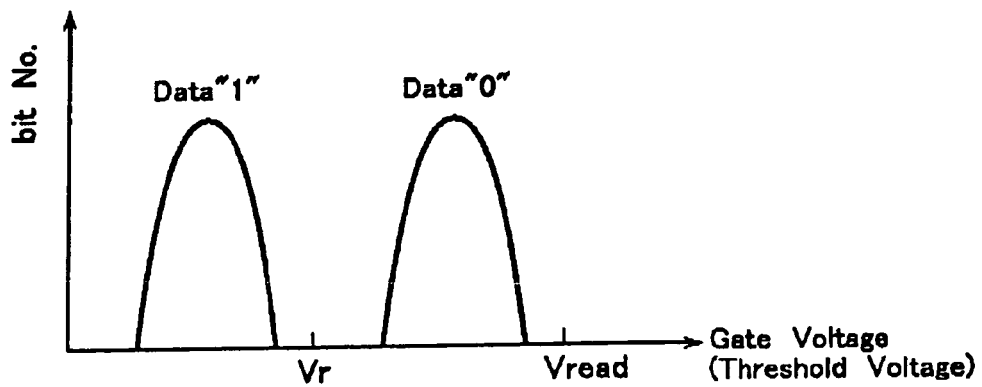
FIG. 9 is a diagram showing a bias relationship of each operation mode of the embodiment 2.
FIG. 10 is a graph showing data threshold voltage distributions of data.

At the time of data writing, apply a write voltage Vpgm to a selected word line while applying an appropriate mid-level voltage Vpass to the other nonselected word lines and the dummy word lines DWL. The mid voltage Vpass is higher than the supply voltage Vcc. Note here that prior to this write voltage application, either Vss or Vcc is given to the bit line BL in accordance with write data "0," "1" while setting the bitline side select gate line SGD at Vcc and the source-line side select gate line SGS at 0V, thereby precharging the NAND cell channels. A channel with "0" data given thereto becomes at Vss, whereas a "1" data-channel becomes in the floating state of Vcc-Vth (Vth is the threshold voltage of select gate transistor). By application of the above-stated write voltage Vpgm in this state, a "0" data-given memory cell experiences electron injection from its channel onto floating gate. In a "1" data-given cell, its channel potentially rises up due to the presence of capacitive coupling so that no electrons are injected to its floating gate. In this way, any memory cell with "0" data given thereto along a word line becomes in the "0" write state that is high in threshold voltage as shown in FIG. 10.

In this data write mode also, with the use of the dummy cells DC0-DC1 which are applied with the same mid voltage Vpass as that of nonselected word lines, the same write condition is establishable even when any one of the sixteen memory cells is selected. Accordingly, variation or deviation of write data within the NAND cell unit is lowered, thereby enabling improvement in uniformity of write threshold voltage values.

Also note that in the case of this embodiment, any complicated operations different from the prior art are not required with respect to the erase/write/read operations. Thus, the intended operations may be performed successfully under much similar operating conditions to the prior art.

Another advantage of this embodiment is that the NAND cell units decrease in influenceability of variations in on-chip element characteristics in manufacturing processes thereof. This point will be explained in detail below. Generally in semiconductor memories, it is becoming more difficult to perform pattern formation at terminate end portions of a cell array which exhibit disturbance of periodicity with an increase in miniaturization of memory cells. In NAND-EEPROMs, one end of a NAND cell unit is connected to a source line SL, and the other end is coupled to a bit line BL. Select gate transistors are inserted between these source and bit lines and a cell array. It is thus required that the select gate transistors SG be designed so that each is cut off deeply enough to enable the NAND cell unit to be completely electrically disconnected or isolated from its associated source line and bit line when the need arises. In view of this, transistors are used which are greater in gate length than normal memory cells. As a result, the distance or layout pitch of two select gate lines interposing contact portions of the bit line and source line is different from the distance of word lines; further, a select gate line width is different from the wordline width. Therefore, the periodicity of the cell array disturbs at here. In this way, the memory cell array looses the periodicity at its end portions. This results in occurrence of an event that any required exposure and micro-patterning processes are no longer achievable with desired feature sizes.

In this embodiment, the dummy cells are disposed between the select gate transistors and the memory cells. Thus the periodicity becomes excellent in the range of the memory cell array used for actual data storage. This makes the feature size uniform, resulting in on-chip elements being equivalent in characteristics to one another. The dummy cells are encountered with no serious problems even when their sizes are little deviated from a desired size, because these are not operated as real data storage cells.

More specifically, in cases where such dummy cells are not disposed, a need is felt to contrive a scheme for designing the distance between select gate lines and word lines and also the wordline width in order to maintain the wordline width constantly among cells. For example, make the distance between a select gate line and its neighboring word line larger than the distance between other word lines. In contrast, this invention is such that the dummy cell is laid out in close proximity to the select gate line. With this "dummy cell layout" feature, disturbance of the periodicity within the cell array becomes no longer occurrable. In addition, since the dummy cell is free from problems even when its line width deviates slightly, it becomes possible to achieve the pattern layout with the minimum feature size. At this time, an area loss occurring due to the dummy cell layout is less in a practical sense.

Embodiment 2

Figure 6:
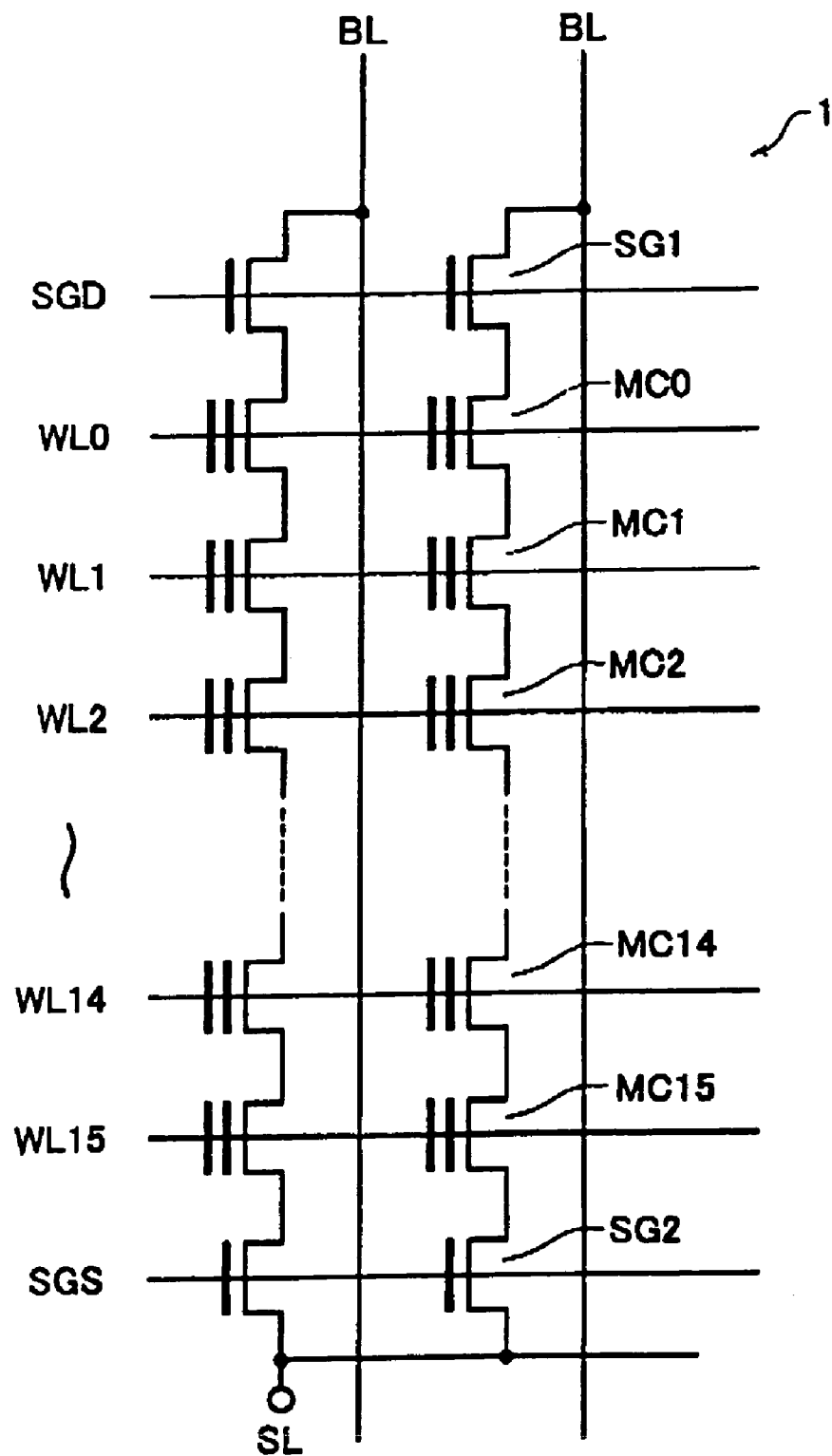
FIG. 6 shows an equivalent circuit of a memory cell array of an embodiment 2.
Figure 7:
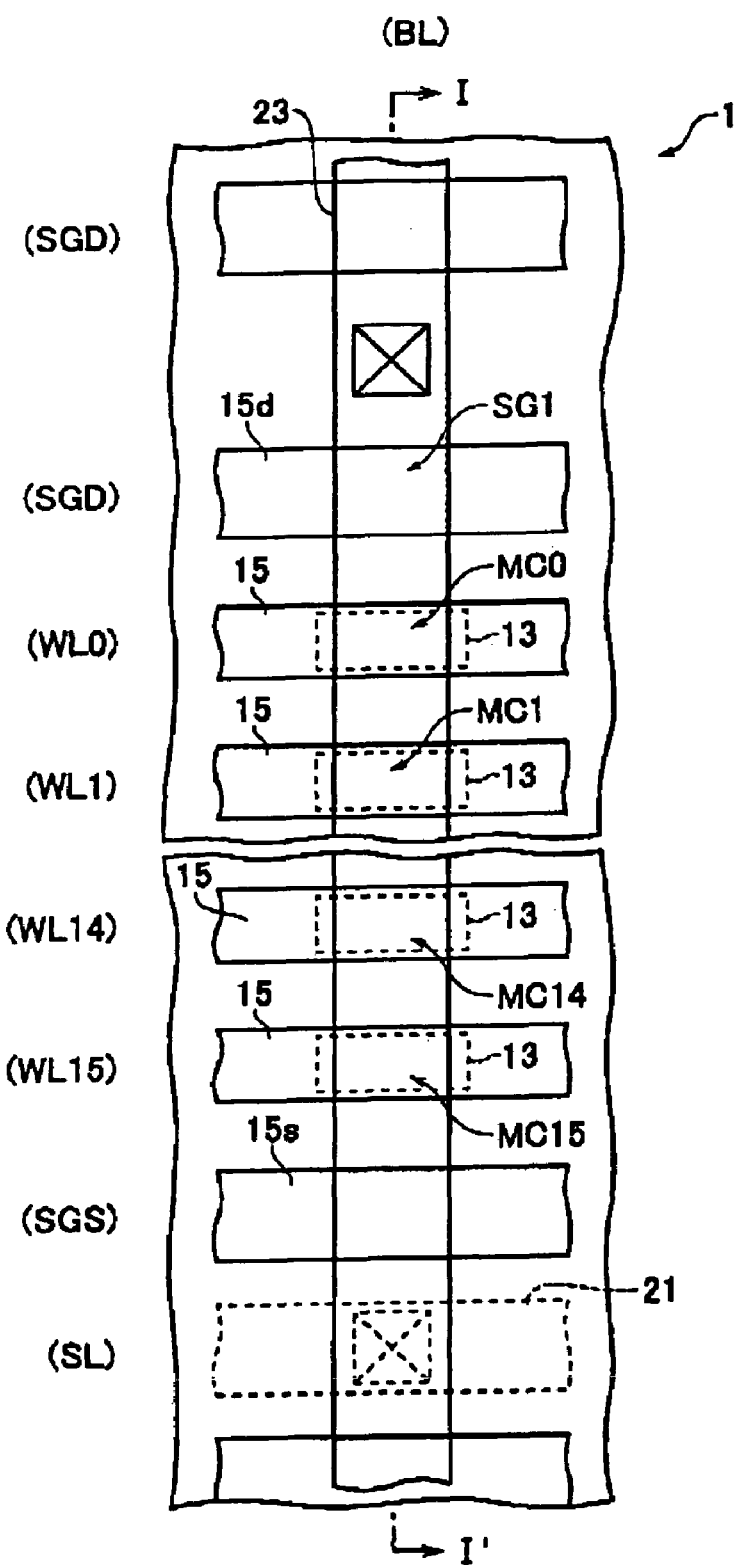
FIG. 7 is a plan view of the memory cell array.
Figure 8:
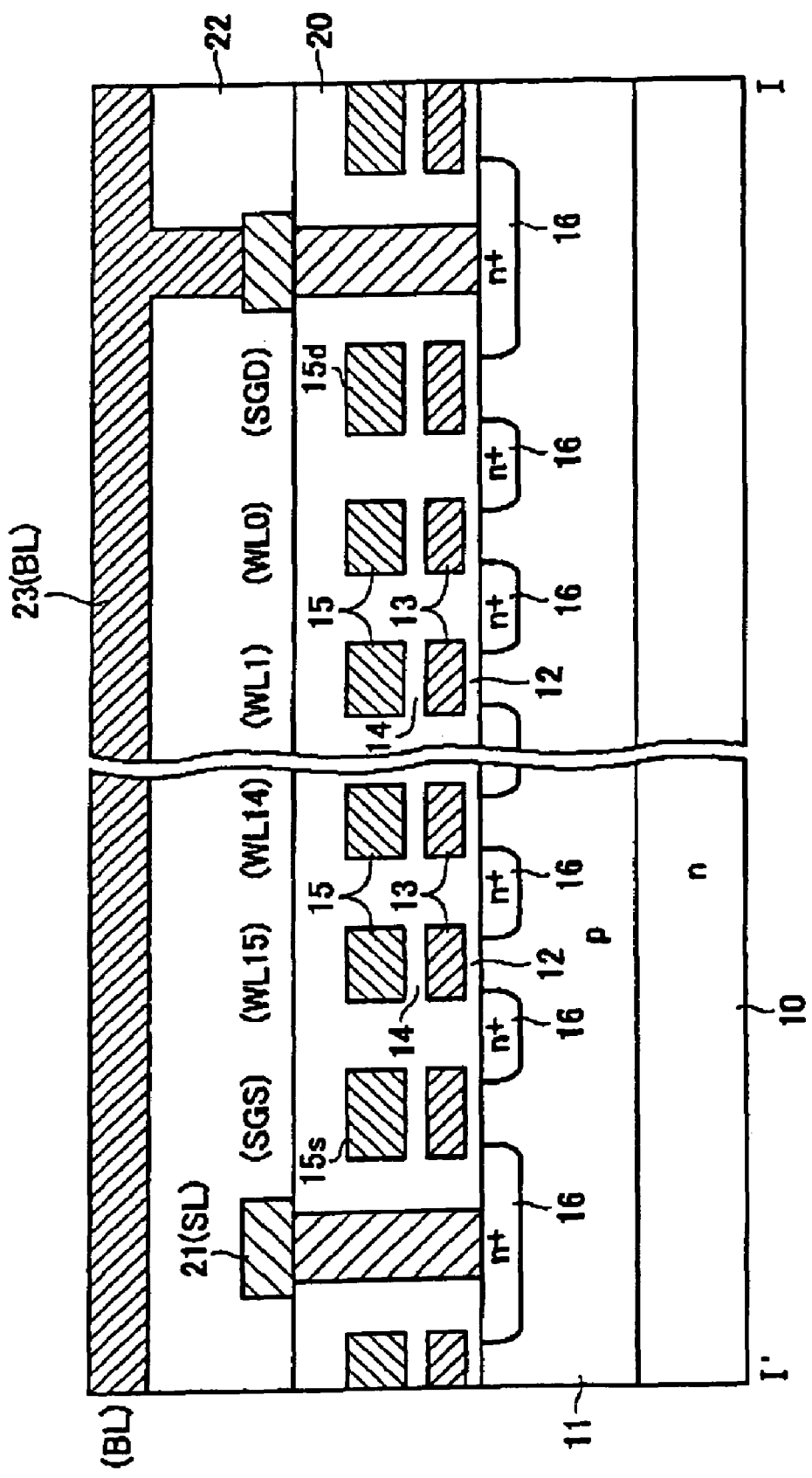
FIG. 8 is a sectional view of FIG. 7 along line I-I'.

A cell array equivalent circuit of a NAND-EEPROM in accordance with an embodiment 2 is shown in FIG. 6. A plan view and its cross-sectional view along line I-I' are shown in FIGS. 7 and 8. Parts or components corresponding to those of the previous embodiment 1 are denoted by the same reference characters, with a detailed explanation eliminated herein.

In this embodiment, a NAND cell unit has sixteen memory cells MC0 to MC15 and is similar to the prior art in cell array configuration and structure. This embodiment does not employ dummy cells such as those used in the embodiment 1. In such the NAND cell array, the wordline dependency takes place in erase and write threshold voltage values when using the same erase and write methods as those in the prior art, as has been stated previously.

Consequently in this embodiment, for the memory cells next to the select gate transistors, apply a different bias voltage condition from the other cells to thereby remove the above-noted wordline dependency.

Figure 14:
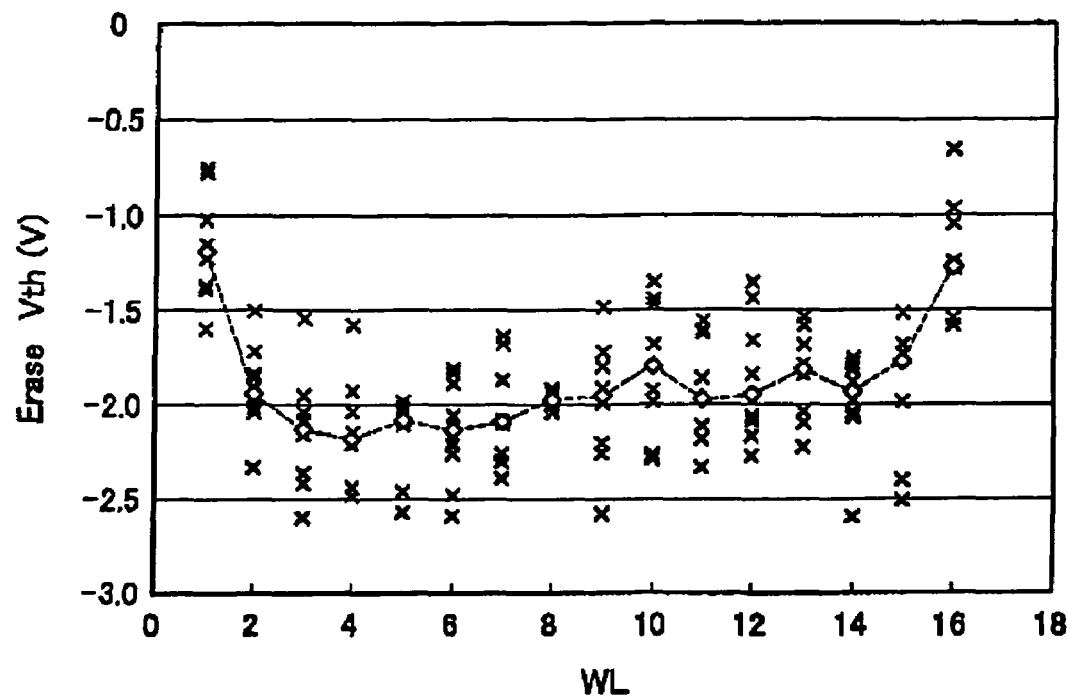
FIG. 14 is a graph showing the word-line dependency characteristics of erase threshold voltage of prior art NAND-EEPROM.

To be more concrete, FIG. 9 shows a bias relationship in each operation mode of this embodiment. Although the same 0-V voltage is ordinarily applied to every word line within a NAND cell unit at the time of data erase, this embodiment is arranged to apply 0V only to certain word lines WL0 and WL15 adjacent to the select gate lines SGD and SGS while applying to the remaining word lines WL1-WL14 a 0.7-V voltage higher than the former. Note here that 0.7V is equivalent to a difference in threshold voltage between the word lines WL0 and WL15 and the wordlines WL1-WL14 in view of the wordline dependency of erase threshold voltage shown in FIG. 14. The other conditions are similar to those of the prior art: set the select gate lines SGD-SGS and source line SL plus bit line BL in the floating state; and, apply an erase voltage Vera=18V to the p-type well of an erase block.

By setting the low level voltage to be given to the control gates of the memory cells on the select gate side so that this voltage is lower than that given to the remaining memory cells in this way, it becomes possible to make the after-erase threshold voltage distribution uniform. Furthermore, it becomes possible to narrow the after-erase threshold voltage distribution, by comparing average values of the threshold voltages on a per-wordline basis after having erased by setting each wordline at 0V and then letting a voltage corresponding to a deviation of the threshold voltage of a respective word line be the wordline voltage at the time of erase. At this time, with the threshold voltage of a memory cell which is the highest in erase threshold voltage (and thus is difficult to be erased) being as a reference value, apply a voltage that is potentially equivalent to a difference of such threshold voltage to a wordline during erasing.

As for data write, let the write pulse voltage step-up condition be different between when the word line WL0 or WL15 next to the select gate line SGD, SGS is selected and when any one of the other wordlines WL1-WL14 is selected. Although the "step write" technique is not specifically explained in the previous embodiment, standard NAND-EEPROMs are designed to use a method for forcing a wordline voltage to potentially change in short and essentially uniform steps rather than continuously while at the same time confirming or checking write data of a plurality of memory cells (a page of cells) along a single wordline—that is, while verifying the resultant write state on a per-bit basis.

Figure 12:
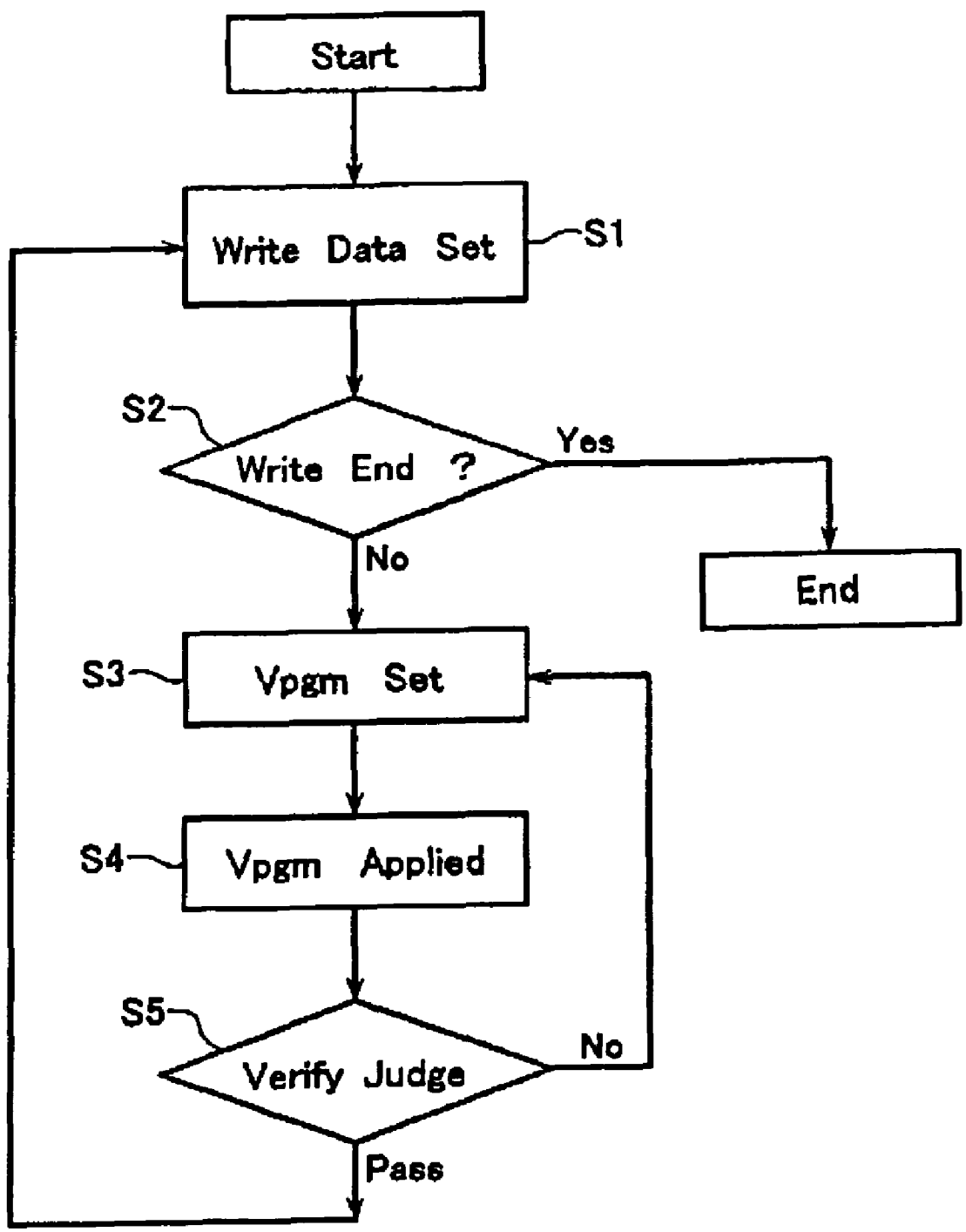
FIG. 12 is a flow diagram showing a write sequence of the embodiment 2.
Figure 13:
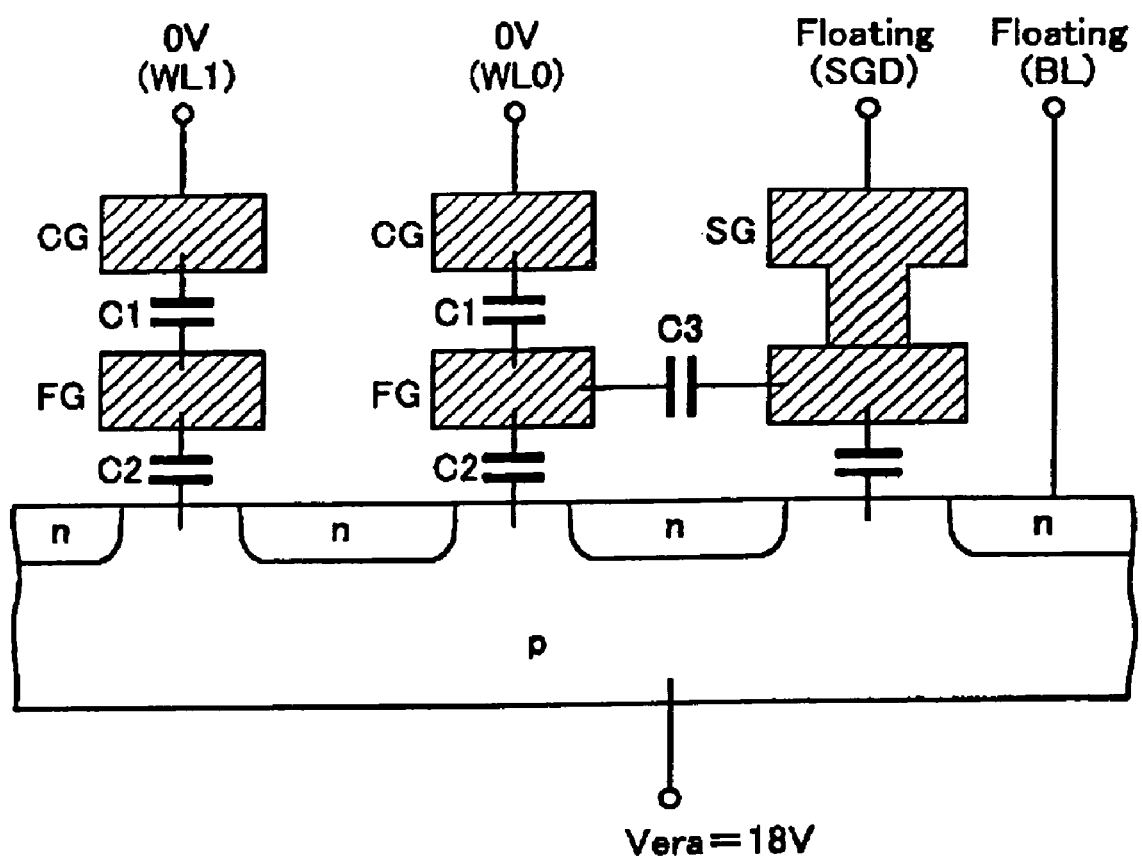
FIG. 13 is a diagram for explanation of a problem faced with one prior known NAND-EEPROM.

More specifically, as shown in FIG. 12, set write data (S1), make certain that the writing of all bits is not completed yet (S2), and set an initial value of the write pulse voltage Vpgm (S3). Then, apply a write pulse (S4); thereafter, perform verify-read determination for verification of the resulting write state on a per-bit basis (S5). If the judgment in NO, then cause the write pulse voltage to step up and then repeat similar write and verify-read operations. When the verify test is passed, invert a corresponding bit of the write data being held, and ensure that no write is done to such bit at later stages. And, determine that writing of all the bits corresponding to a page is completed (S2); then, terminate the write cycle.

Figure 11:
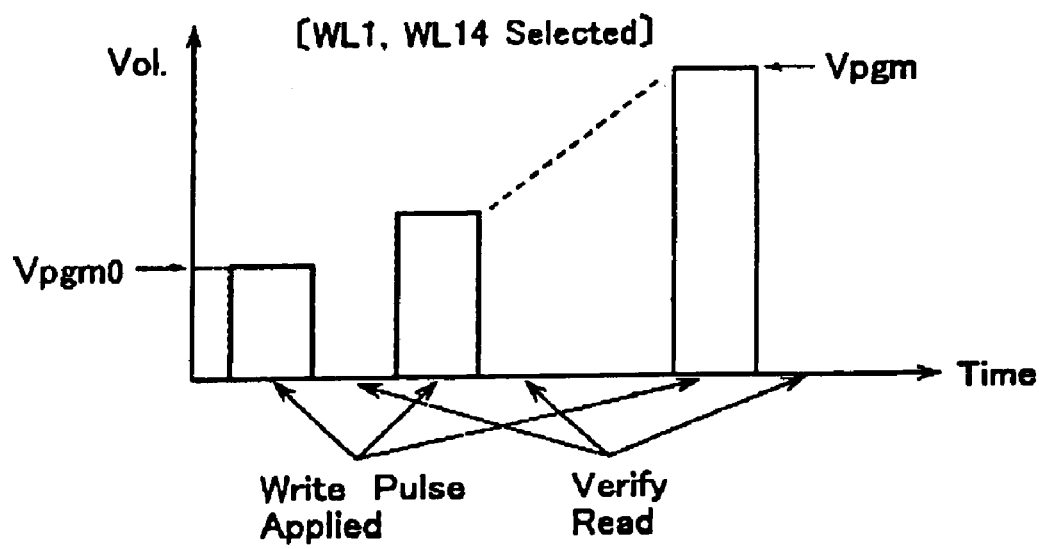
FIG. 11 graphically shows write pulse application examples of the embodiment 2.
Figure 11:
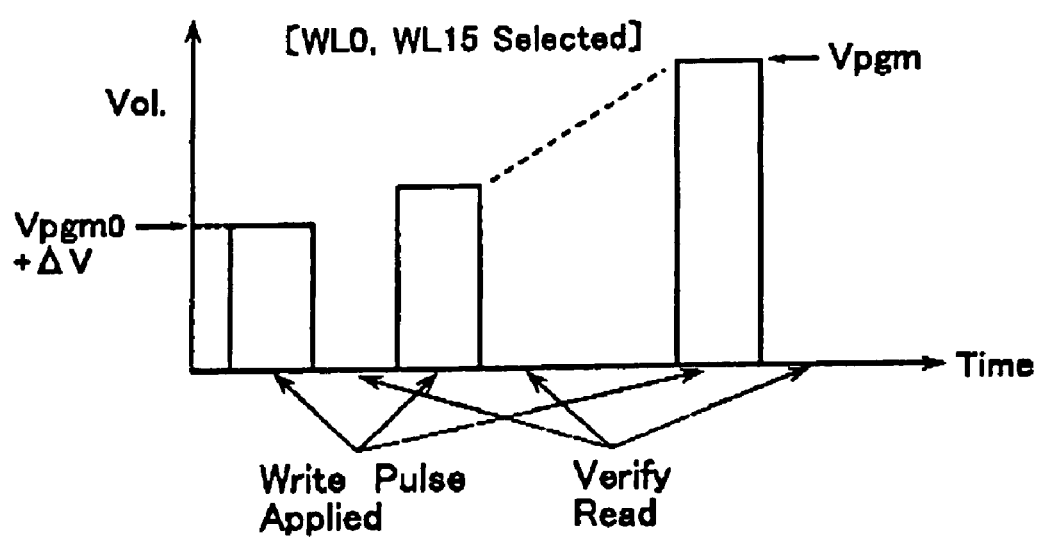
Figure 15:
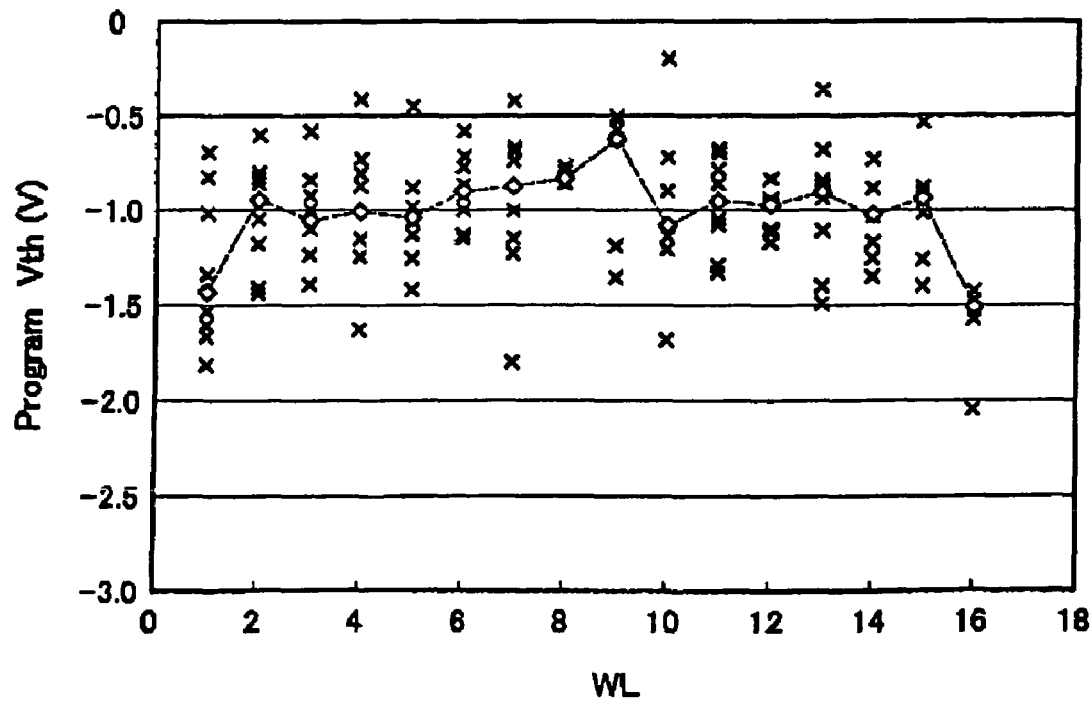
FIG. 15 is a graph showing the wordline dependency characteristics of write threshold voltage of prior art NAND-EEPROM.

FIG. 11 shows step-up voltages upon execution of the write cycle control stated above in two events: when any one of the word lines WL1-WL14 is selected, and when wordline WL0, WL15 is selected. More specifically, when one of the wordlines WL1-WL14 is selected, let the initial value of a write pulse voltage be set at Vpgm0. When wordline WL0, WL15 is selected, make use of an initial value Vpgm0+ΔV, which is little higher than the value Vpgm0. As shown in FIG. 15, the memory cells on the select gate transistor side tend to delay in write when compared to the remaining cells under the same write conditions. In contrast, with the write pulse initial value setting feature stated above, it is possible to permit the execution number of write loops to stay constant regardless of any wordline, thus making it possible to obtain a uniform write threshold voltage distribution.

The invention claimed is:

1. A nonvolatile semiconductor memory device comprising:
   a plurality of electrically rewritable nonvolatile memory cells connected in series; and
   a select gate transistor connected in series to the series-connected memory cells, wherein a memory cell adjacent to said select gate transistor is applied with a bias voltage different from a bias voltage of remaining memory cells during data erase,
   wherein data erase is for erasing all memory cells formed in a block in a well region at a time by holding control gates thereof at a low level while applying a high level of erase voltage to said well, and wherein a low level voltage being given to a control gate of the memory cell adjacent to said select gate transistor is set lower than that being applied to control gates of remaining memory cells.

2. A nonvolatile semiconductor memory device comprising:
   a plurality of electrically rewritable nonvolatile memory cells connected in series; and
   a select gate transistor connected in series to the series-connected memory cells, wherein a memory cell adjacent to said select gate transistor is applied with a bias voltage different from a bias voltage of remaining memory cells during data erase,
   wherein during data writing for giving to a selected memory cell a write pulse voltage with a step-like increase in voltage value, an initial value of a write pulse voltage when the memory cell adjacent to said select gate transistor is selected is set at a different value from that when another memory cell is selected.

3. The device according to claim 2, wherein during said data write, the initial value of the write pulse voltage when the memory cell adjacent to said select gate transistor is selected is set higher than that when another memory cell is selected.

* * * * *